United States Patent
Hollmer

(10) Patent No.: US 7,132,873 B2
(45) Date of Patent: Nov. 7, 2006

(54) METHOD AND APPARATUS FOR AVOIDING GATED DIODE BREAKDOWN IN TRANSISTOR CIRCUITS

(75) Inventor: Shane C. Hollmer, San Jose, CA (US)

(73) Assignee: Emosyn America, Inc., Sunnyvale, CA (US)

( * ) Notice: Subject to any disclaimer, the term of this patent is extended or adjusted under 35 U.S.C. 154(b) by 132 days.

(21) Appl. No.: 10/338,551

(22) Filed: Jan. 8, 2003

(65) Prior Publication Data

US 2004/0130376 A1    Jul. 8, 2004

(51) Int. Cl.
 *H03K 5/08*    (2006.01)
(52) U.S. Cl. ............... 327/312; 327/316; 327/332
(58) Field of Classification Search ........ 327/108–112, 327/309, 312, 313, 316, 318, 319–323, 332
See application file for complete search history.

(56) References Cited

U.S. PATENT DOCUMENTS

| | | | | |
|---|---|---|---|---|
| 4,318,040 A | * | 3/1982 | Hilbourne | .......... 323/312 |
| 4,868,415 A | * | 9/1989 | Dunn | .......... 327/122 |
| 4,929,855 A | * | 5/1990 | Ezzeddine | .......... 327/427 |
| 5,012,123 A | * | 4/1991 | Ayasli et al. | .......... 307/112 |
| 5,576,635 A | | 11/1996 | Partovi et al. | |
| 5,696,459 A | * | 12/1997 | Neugebauer et al. | .......... 327/108 |
| 5,809,312 A | * | 9/1998 | Ansel et al. | .......... 713/300 |

* cited by examiner

*Primary Examiner*—Kenneth B. Wells

(57) ABSTRACT

An N-channel transistor protection circuit and method are disclosed that prevent gated diode breakdown in N-channel transistors that have a high voltage on their drain. The disclosed N-channel protection circuit may be switched in a high voltage mode between a high voltage level and a lower rail voltage. A high voltage conversion circuit prevents gated diode breakdown in N-channel transistors by dividing the high voltage across two N-channel transistors, MXU0 and MXU1, such that no transistor exceeds the breakdown voltage, $V_{breakdown}$. An intermediate voltage drives the top N-channel transistor, MXU0. The top N-channel transistor, MXU0, is gated with a voltage level that is at least one N-channel threshold, $V_{tn}$, below the high voltage level, $V_{ep}$, using the intermediate voltage level, nprot. The drain voltage of MXU0 will be at least one N-channel threshold, $V_{tn}$, lower than the input voltage level, nprot, and the drain voltage $V_d$ of the bottom N-channel transistor, MXU1, is limited to less than the breakdown voltage, $V_{breakdown}$.

18 Claims, 5 Drawing Sheets

US 7,132,873 B2

METHOD AND APPARATUS FOR AVOIDING GATED DIODE BREAKDOWN IN TRANSISTOR CIRCUITS

FIELD OF THE INVENTION

The present invention relates generally to a method and apparatus for protecting transistors in a circuit, and more particularly, to a method and apparatus for preventing gated diode breakdown in a voltage conversion circuit.

BACKGROUND OF THE INVENTION

Many semiconductor circuits require the switching of high voltages. For example, non-volatile memory devices require voltages to erase and program the memory device that are significantly higher than the voltages needed for other device functions, such as reading data from the memory or communicating with other semiconductor circuits. Thus, semiconductor circuits often employ a voltage conversion circuit to provide the high voltage levels required by the non-volatile memory and other associated devices.

FIG. 1 illustrates a conventional high voltage conversion circuit 100. As shown in FIG. 1, the high voltage conversion circuit 100 receives a logical input signal (0 volts to $V_{DD}$), input, and a voltage level, $V_{ep}$, e.g., on the order of 3 to 12 volts. The logical input signal, input, may be set to a low logic value, for example, to pass the voltage level, $V_{ep}$, to the output and to a high logic value to pass 0 volts to the output. Thus, the output of the high voltage conversion circuit 100 switches between 0 volts and the applied voltage level. $V_{ep}$, depending on the value of the applied logical input signal. The feedback transistor MP4 gates the P-channel output transistor MP7 with the applied voltage level, $V_{ep}$. In this manner, the transistor MP7 is turned off when the output is low. The N-channel output driver MXU1 is gated with a high voltage level, $V_{dd}$, to pass 0 volts to the output.

Gated diode breakdown is a well-known condition that can occur in a metal oxide semiconductor (MOS) transistor, such as the transistor MXU1 in FIG. 1, under certain conditions. FIG. 2 is a cross sectional view of the transistor MXU1 of FIG. 1. The gated diode breakdown condition occurs in the junction 210 between the N+drain and the P-substrate, when a high voltage is applied to the drain of the transistor MXU1 and the gate and substrate of the transistor MXU1 are grounded. The transistor MXU1 is off in this state, but the high voltage applied to the drain can cause the reverse biased diode from the drain to the P-substrate to break down (right under the gate where the field is the highest), causing an avalanche of current and impairing circuit operation.

The actual drain voltage at which gated diode breakdown will occur, referred to herein as $V_{breakdown}$, depends on the transistor fabrication process. In one particular process, a drain voltage on the order of 10 volts has been observed to cause a gated diode breakdown. Thus, to avoid gated diode breakdown, the voltage applied to the drain must remain below the breakdown voltage, $V_{breakdown}$, if the gate voltage is grounded. As previously indicated, however, in many semiconductor circuits, voltages greater than the breakdown voltage are needed. For example, the erase and program operations for non-volatile memories on a secure integrated circuit require voltage levels of 10 and 12 volts, respectively, on the high voltage power supply, $V_{ep}$.

FIG. 3 illustrates a known technique for avoiding gated diode breakdown, for example, in high voltage conversion circuits, when the breakdown voltage, $V_{breakdown}$, is less than the required high voltage level, $V_{ep}$. The modified high voltage conversion circuit 300 includes a logical input signal, input, that operates in the same manner as the logical input signal, input, of FIG. 1 whereby a low logic value, for example, passes the voltage level, $V_{ep}$, to the output and a high logic value passes 0 volts to the output. As shown in FIG. 3, the modified high voltage conversion circuit 300 places an additional P-channel transistor MP5 and MP8 in series with the existing P-channel transistors MP4 and MP7, respectively. In this manner, when the gate voltage applied to the existing transistors MP4 and MP7 is the high voltage level, $V_{ep}$, another P-channel transistor MP5 or MP8, respectively, is placed in series so that the drain voltage on transistors MP4 and MP7 will not be pulled to ground. Rather, the drain to bulk voltage on transistors MP4 and MP7 will be pulled to a value below the breakdown voltage, $V_{breakdown}$, i.e., approximately $V_{ep}$ minus ($V_{dd}$ plus $V_{tp}$), where $V_{tp}$, is one P-channel threshold, since the transistor bulk has a voltage level of $V_{ep}$ for a P-channel transistor.

Similarly, the N-channel transistor MXU1 is protected from gated diode breakdown by placing an additional N-channel transistor MXU0 in series with the existing transistor MXU1. Transistor MXU0 is gated by $V_{dd}$, thus preventing the high voltage on the output from reaching the drain of MXU1 and limiting the drain voltage on transistor MXU1 to a value below the breakdown voltage, $V_{breakdown}$. It is noted that Vdd on the gate of MXU0 also eliminates the gated-diode condition on MXU0 because the transistor is on with a channel formed under the gate.

While the modified high voltage conversion circuit 300 effectively prevents gated diode breakdown in the N-channel transistor, the modified high voltage conversion circuit 300 is only capable of switching between an output voltage of 0 volts and the high voltage level of 10 or 12 volts. For some applications, however, it is necessary, to switch between an output voltage of $V_{dd}$ and the high voltage level of 10 or 12 volts, which is not possible with the cascaded transistor implementation shown in FIG. 3.

A need therefore exists for an N-channel protection circuit that prevents gated diode breakdown in N-channel transistors that have a high voltage on their drain, and provides greater flexibility on the output voltages that may be obtained. A further need exists for an improved N-channel protection circuit that prevents gated diode breakdown in N-channel transistors by dividing the high voltage such that no transistor has a drain voltage that exceeds the breakdown voltage, $V_{breakdown}$.

SUMMARY OF THE INVENTION

Generally, an N-channel transistor protection circuit and method are disclosed that prevent gated diode breakdown in N-channel transistors that have a high voltage on their drain. The disclosed N-channel protection circuit may be switched in a high voltage mode between a high voltage level and a bottom rail voltage. According to one aspect of the invention, a high voltage conversion circuit prevents gated diode breakdown in N-channel transistors by dividing the high voltage across two N-channel transistors, MXU0 and MXU1, such that no transistor exceeds the breakdown voltage, $V_{breakdown}$. Generally, the present invention creates an intermediate voltage to drive the top N-channel transistor, MXU0.

The present invention gates the top N-channel transistor, MXU0, with a voltage level that is at least one N-channel threshold, $V_{tn}$, below the high voltage level, $V_{ep}$, using the intermediate voltage level, nprot. In this manner, the source voltage of MXU0 will be at least one N-channel threshold, $V_{tn}$, lower than the input voltage level, nprot, and the drain voltage $V_d$ of the bottom N-channel transistor, MXU1, is limited to less than the breakdown voltage, $V_{breakdown}$. The intermediate voltage level, nprot, should be at least one N-channel threshold, $V_{tn}$, above the bottom rail voltage (i.e., to turn on MXU0 and pass the bottom rail voltage to the output) and at least below the breakdown voltage, $V_{breakdown}$, plus one N-channel threshold, $V_{tn}$. In this manner, the drain voltage of MXU1 is guaranteed to be lower than $V_{breakdown}$ and MXU0 is guaranteed to be able to pass the bottom rail voltage. A more complete understanding of the present invention, as well as further features and advantages of the present invention, will be obtained by reference to the following detailed description and drawings.

DETAILED DESCRIPTION

The present invention provides an N-channel protection circuit 400, discussed further below in conjunction with FIG. 4, that prevents gated diode breakdown in N-channel transistors that have a high voltage on their drain, and provides greater flexibility on the output voltages that may be obtained. The high voltage conversion circuit 400 prevents gated diode breakdown in N-channel transistors by dividing the high voltage such that no transistor exceeds the breakdown voltage, $V_{breakdown}$. Generally, the present invention creates an intermediate voltage that is below the high voltage level, $V_{ep}$, to drive the top N-channel transistor MXU0.

Figure 1:
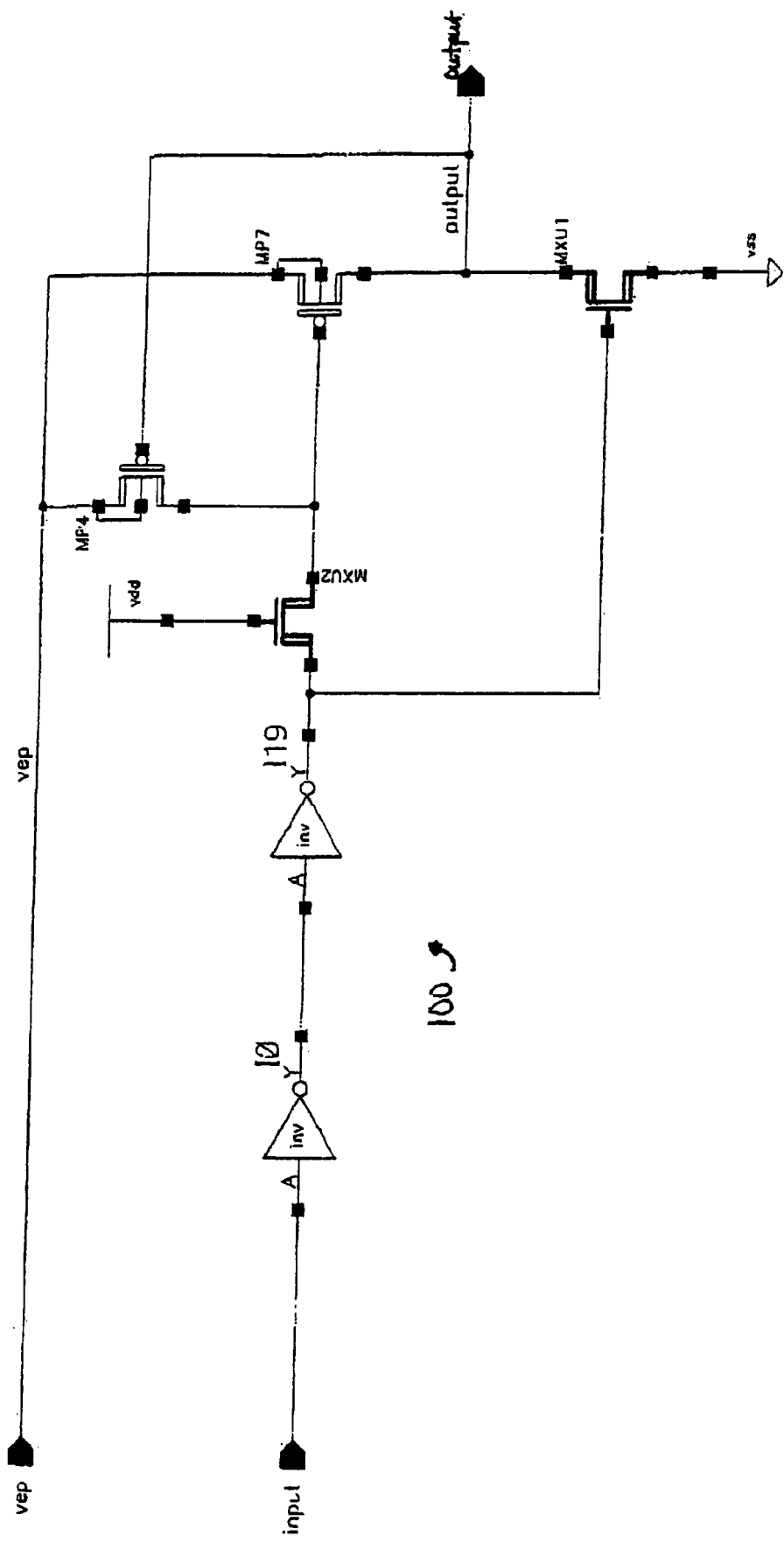
FIG. 1 is a circuit diagram of a conventional high voltage conversion circuit.
Figure 2:
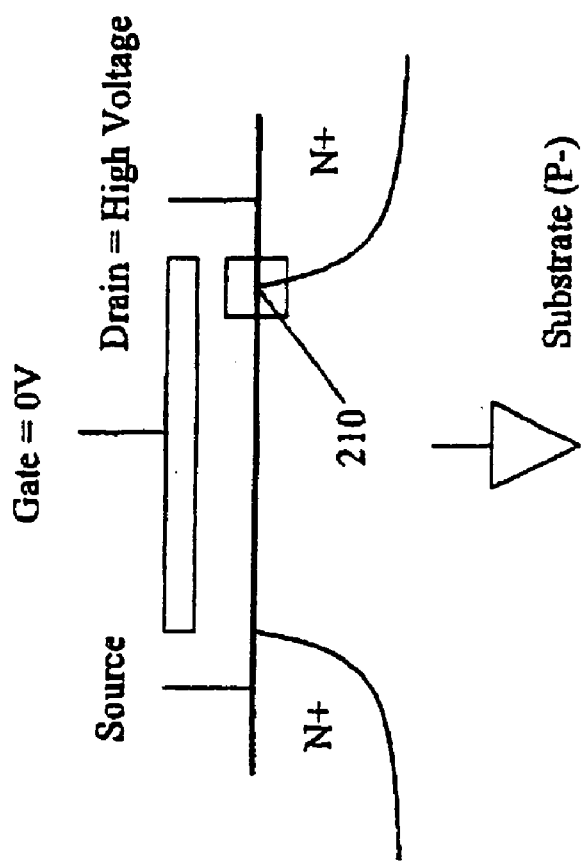
FIG. 2 is a cross sectional view of the transistor MXU1 of FIG. 1.
Figure 3:
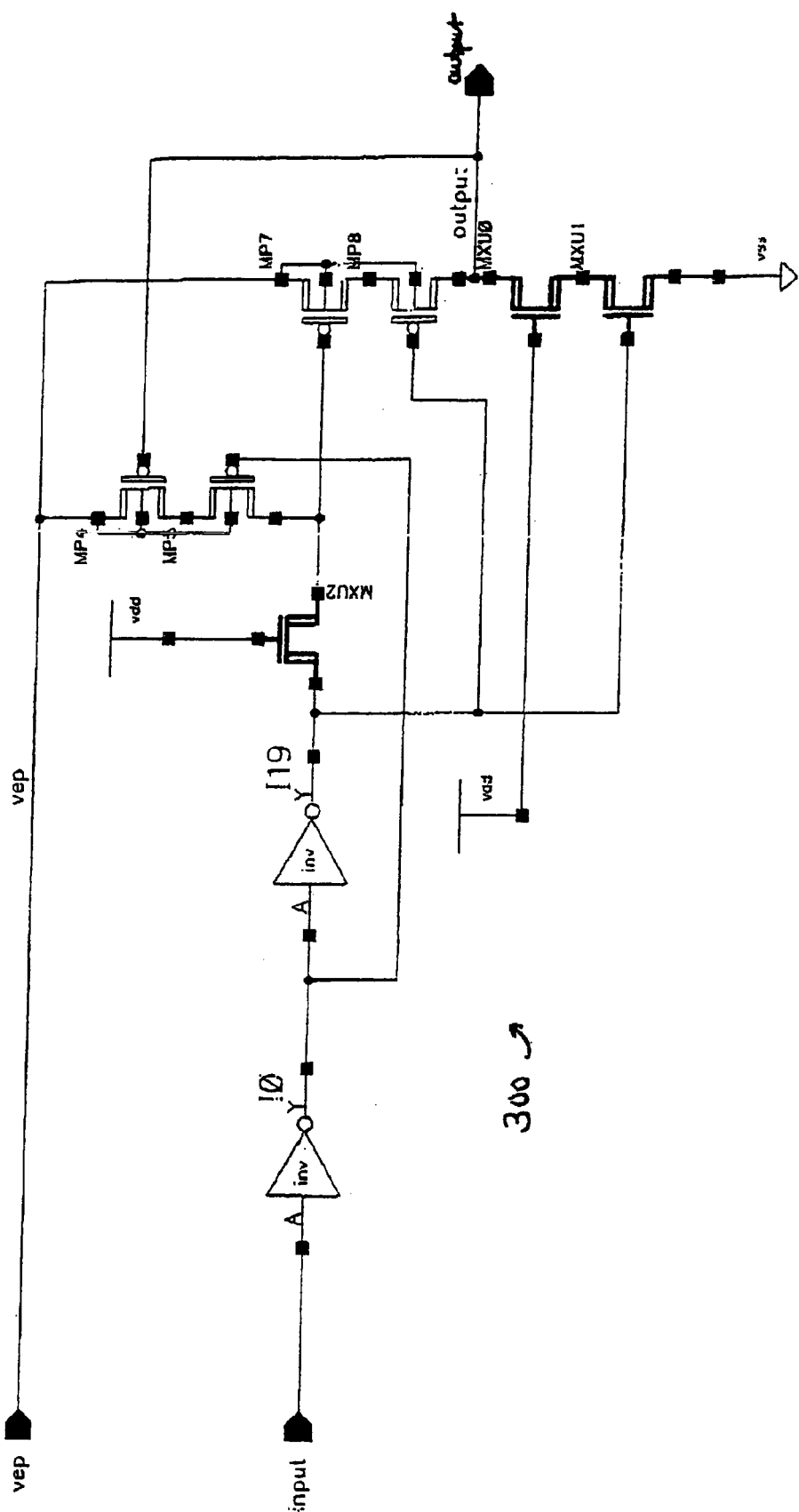
FIG. 3 illustrates a known technique for avoiding gated diode breakdown in a high voltage conversion circuit, such as the circuit of FIG. 1.
Figure 4:
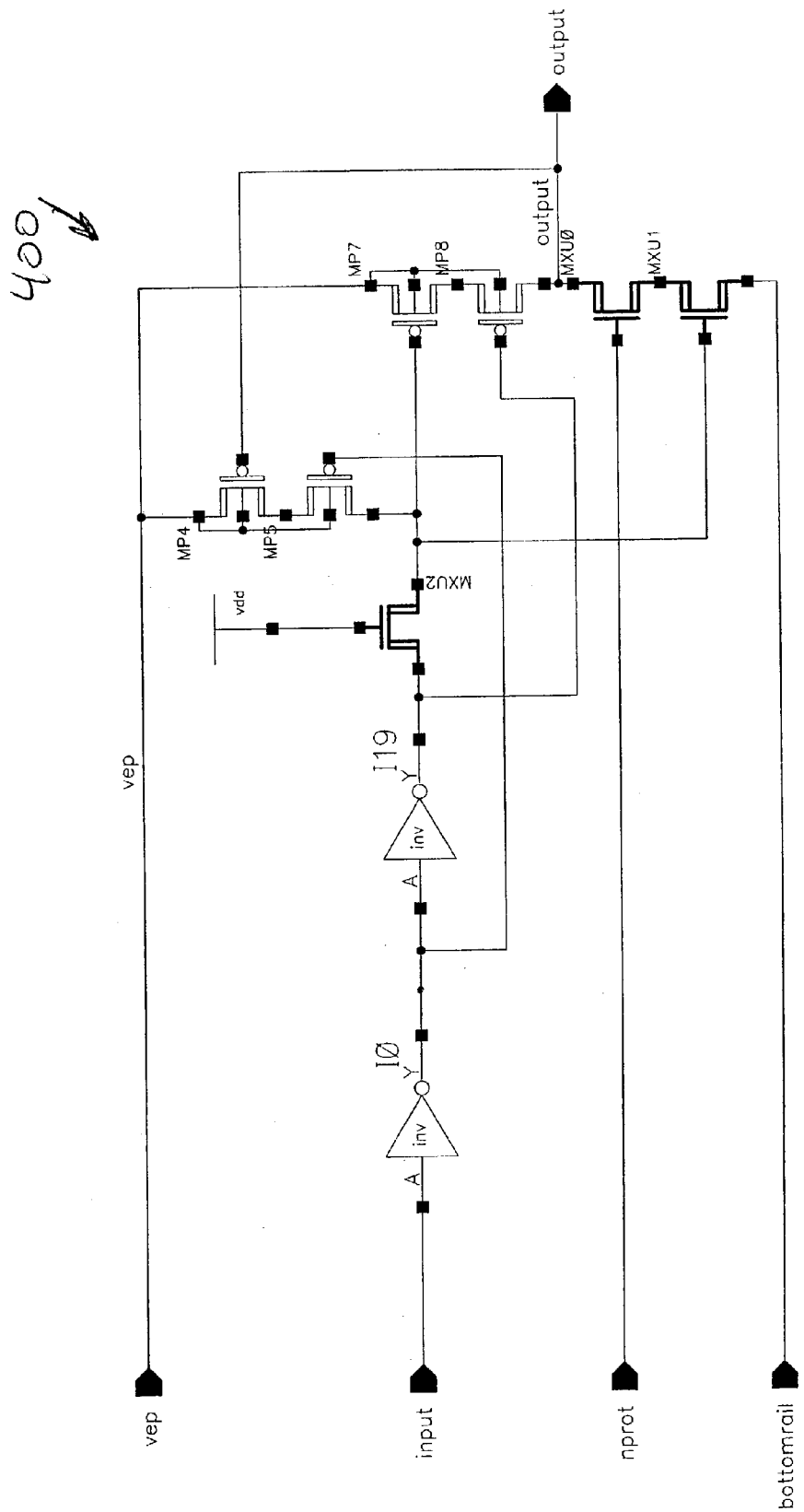
FIG. 4 is a circuit diagram of a high voltage conversion circuit incorporating features of the present invention.

FIG. 4 illustrates a high voltage conversion circuit 400 incorporating features of the present invention. As shown in FIG. 4, the high voltage conversion circuit 400 includes sets of pairs of transistors, MP4 and MP5, MP7 and MP8, and MXU0 and MXU1, in a similar manner to the modified high voltage conversion circuit 300 of FIG. 3. In order to be able to pass $V_{dd}$ to the output of the high voltage conversion circuit 400, the transistors MXU0 and MXU1 are gated by a higher voltage.

The present invention recognizes, however, that if the transistors MXU0 and MXU1 were gated by the high voltage level, $V_{ep}$, the transistor MXU1 would be subject to a gated diode breakdown condition. According to one aspect of the present invention, MXU0 is gated to a voltage level that is at least one N-channel threshold, $V_{tn}$, below $V_{ep}$, using an input voltage level, nprot. In this manner, the source voltage of MXU0 will be at least one N-channel threshold, $V_{tn}$, lower than the input voltage level, nprot, and the drain voltage $V_d$ of MXU1 can be limited to less than the breakdown voltage, $V_{breakdown}$. An exemplary circuit for generating the input voltage level, nprot, is discussed below in conjunction with FIG. 5. Generally, the input voltage level, nprot, should be at least one N-channel threshold, $V_{tn}$, above the bottom rail voltage (i.e., to turn on MXU0 and pass the bottom rail voltage to the output) and at least below the breakdown voltage, $V_{breakdown}$, plus one N-channel threshold, $V_{tn}$. In this manner, the high voltage conversion circuit 400 can pass the bottom rail voltage to the output and also protect transistor MXU1 from gated-diode breakdown.

In one exemplary embodiment where the high voltage conversion circuit 400 generates the necessary voltages for a non-volatile memory, and the high voltage level, $V_{ep}$, is 12 volts for an erase mode and 10 volts for a program mode, the input voltage level, nprot, is set in the high voltage mode to a value that is two N-channel thresholds, $2V_{tn}$, below $V_{ep}$, which is adequate to pass the bottom rail voltage during an erase mode, while still avoiding a gated diode breakdown condition on transistor MXU1 in both program and erase modes. In a low voltage mode for a non-volatile memory implementation, the input voltage level, nprot, is set to a value that is one N-channel threshold, $V_{tn}$, below $V_{dd}$.

Figure 5:
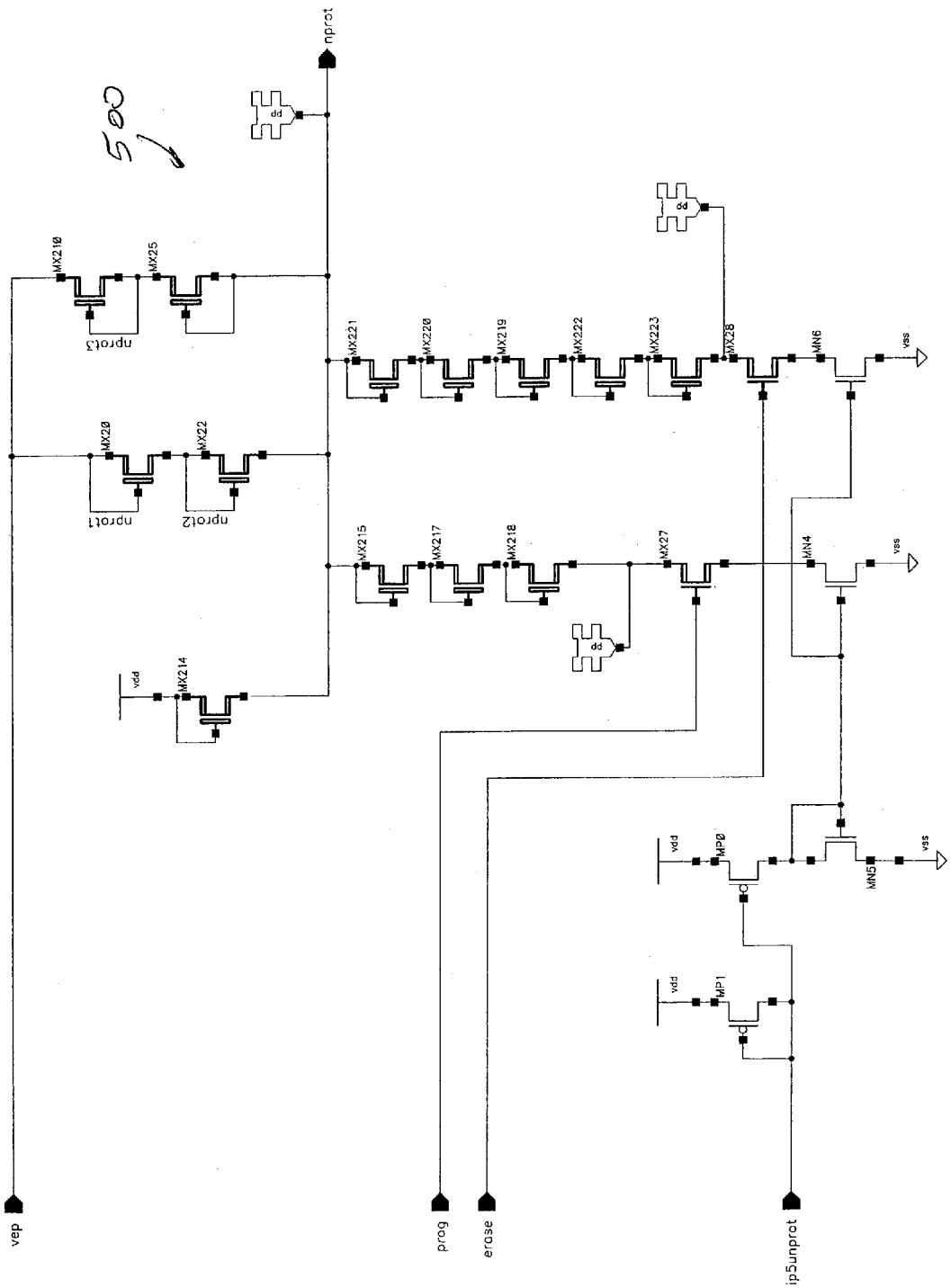
FIG. 5 is a circuit diagram of an exemplary nprot generation circuit that generated the "nprot" voltage level of FIG. 4.

In order to be able to switch between 12 volts and the bottom rail voltage of $V_{dd}$ in an erase mode in a non-volatile memory, however, the source voltage of MXU0 must be raised to $V_{dd}$. Thus, the high voltage conversion circuit 400 also receives an input signal, bottomrail, that is connected to the source of transistor MXU1 and can generally vary between 0 volts and the bottom rail voltage of $V_{dd}$. FIG. 5 is a circuit diagram of an exemplary nprot generation circuit 500. In an exemplary embodiment, the input voltage level, nprot, is two N-channel thresholds, $2V_{tn}$, below $V_{ep}$, in a high voltage mode (i.e., during program or erase, when the output must be 10 or 12 volts, respectively), and is one N-channel threshold, $V_{tn}$, below $V_{dd}$, in a low voltage mode (i.e., in a normal mode, when the output must be $V_{dd}$).

As shown in FIG. 5, in a high voltage mode, the transistors MX20 ands MX22 are operative to drop the high voltage level, $V_{ep}$, by two N-channel thresholds, $2V_{tn}$, to generate the voltage level, nprot. If the N-channel threshold, $V_{tn}$, is assumed to be 1.0 volts, the voltage level, nprot, will be 8 volts during a program mode and 10 volts during an erase mode, for an exemplary non-volatile memory application. This results in an N-channel Vd on MXU1 of 7 volts during a program mode and 9 volts during an erase mode, which are below the breakdown voltage, $V_{breakdown}$, of 10 volts. At the end of a high voltage mode, it is necessary to discharge the voltage level, nprot, as well as the high voltage level, $V_{ep}$. Transistors MX210 and MX25 will start to pull down the value of the voltage "nprot" when the high voltage level, $V_{ep}$, falls two N-channel thresholds, $2V_{tn}$, below the voltage "nprot," which is low enough value of $V_{ep}$ to begin to remove the N-channel protection provided by the present invention.

In a low voltage mode, the value of "nprot" is limited to one N-channel threshold, $V_{tn}$, below $V_{dd}$ by the transistor MX214. While the value of nprot may float to a somewhat higher voltage level, as there is no current to pull it down during normal operation, the floating voltage level will not have a detrimental impact on circuit operation.

In order to keep the value of nprot from floating to a higher voltage level than desired in a high voltage mode, due to a snapback condition if $V_{ds}$ exceeds 5 volts, the nprot generation circuit 500 may employ stacks of diode-connected N-channel transistors MX215, MX217, MX218 or MX219–MX223 to divide the nprot voltage between the multiple transistors in the stack. The stacked transistors pull a small current of 0.5 μA, mirrored from the input ip5unprot, from nprot during the program and erase modes, to ensure that MX20 and MX22 remain in an ON condition. In a program mode, $V_{ep}$ is equal to 10 volts, and the value of nprot is on the order of 8 volts (assuming each of the two N-channel voltage thresholds is 1 volt), which is divided across the three transistors MX215, MX217, MX218. In an erase mode, $V_{ep}$ is approximately equal to 12 volts, and the value of nprot is on the order of 10 volts, which is divided across the five transistors MX219–MX223. In this manner, a snapback condition is avoided.

It is to be understood that the embodiments and variations shown and described herein are merely illustrative of the principles of this invention and that various modifications may be implemented by those skilled in the art without departing from the scope and spirit of the invention.

I claim:

1. A method for avoiding gated diode breakdown in a voltage conversion circuit having at least two N-channel output driver transistors in series, said voltage conversion circuit capable of switching between a high voltage level and a lower rail voltage in a high voltage mode, said method comprising the steps of:
   providing a logic input value to select between said high voltage level and said lower rail voltage;
   gating one of said at least two N-channel output driver transistors in said high voltage mode with an intermediate voltage level that is between one transistor threshold above said lower rail voltage and one transistor threshold above a breakdown voltage of said at least two N-channel output driver transistors, wherein said intermediate voltage level is generated in said high voltage mode by dropping said high voltage level across at least one N-channel transistor; and
   preventing a snapback condition when generating said intermediate voltage level.

2. The method of claim 1, wherein said intermediate voltage level is at least one transistor threshold level below said high voltage level in said high voltage mode.

3. The method of claim 1, wherein said intermediate voltage level is at least one transistor threshold level above said lower rail voltage in a high voltage mode.

4. The method of claim 1, further comprising the step of applying an input signal to a source of a second one of said at least two N-channel output driver transistors.

5. The method of claim 4, wherein said input signal is normally ground.

6. The method of claim 5, wherein said input signal is switched to said lower rail voltage.

7. The method of claim 1, further comprising the step of discharging said intermediate voltage level following said high voltage mode.

8. The method of claim 1, further comprising the step of employing a plurality of stacked transistors to pull a small current from said intermediate voltage level to ensure that said at least one N-channel transistor remains in an ON condition.

9. The method of claim 8, wherein said small current is generated by a current source.

10. The method of claim 1, wherein said lower rail voltage is equal to a positive voltage level or ground.

11. A voltage conversion circuit capable of switching between a high voltage level and a lower rail voltage in a high voltage mode, comprising:
    at least two N-channel output driver transistors in series;
    a logic input circuit that selects between said high voltage level and said lower rail voltage;
    at least one of said at least two N-channel output driver transistors is gated by an intermediate voltage level between one transistor threshold above said lower rail voltage and one transistor threshold above a breakdown voltage of said at least two N-channel output driver transistors, wherein said intermediate voltage level is generated in said high voltage mode by dropping said high voltage level across at least one N-channel transistor; and
    means for preventing a snapback condition when generating said intermediate voltage level.

12. The voltage conversion circuit of claim 11, wherein said intermediate voltage level is at least one transistor threshold level below said high voltage level in said high voltage mode.

13. The voltage conversion circuit of claim 11, wherein said intermediate voltage level is at least one transistor threshold level above said lower rail voltage in a high voltage mode.

14. The voltage conversion circuit of claim 11, wherein an input signal is applied to a source of a second one of said at least two N-channel output driver transistors.

15. The voltage conversion circuit of claim 14, wherein said input signal is ground.

16. The voltage conversion circuit of claim 15, wherein said input signal is switched to said lower rail voltage.

17. The voltage conversion circuit of claim 11, wherein said lower rail voltage is equal to a positive voltage level or ground.

18. The voltage conversion circuit of claim 11, further comprising a plurality of stacked transistors to pull a small current from said intermediate voltage level to ensure that said at least one N-channel transistor remains in an ON condition.

* * * * *